(12) United States Patent
Bazes

(10) Patent No.: US 8,030,975 B2
(45) Date of Patent: Oct. 4, 2011

(54) METHOD AND APPARATUS FOR GENERATING FREQUENCY DIVIDED SIGNALS

(75) Inventor: Mel Bazes, Haifa (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 0 days.

(21) Appl. No.: 12/886,305

(22) Filed: Sep. 20, 2010

(65) Prior Publication Data

US 2011/0006816 A1  Jan. 13, 2011

Related U.S. Application Data

(63) Continuation of application No. 11/740,638, filed on Apr. 26, 2007, now Pat. No. 7,800,417.

(60) Provisional application No. 60/831,895, filed on Jul. 19, 2006.

(51) Int. Cl.
    *H03K 21/00* (2006.01)
    *H03K 23/00* (2006.01)
    *H03K 25/00* (2006.01)
(52) U.S. Cl. .......... 327/115; 327/117; 327/202; 377/47; 377/48

(58) Field of Classification Search .......... 327/115–118, 327/355–360, 202, 203, 208–212, 218; 377/47, 377/48

See application file for complete search history.

(56) References Cited

U.S. PATENT DOCUMENTS

| 6,249,157 | B1* | 6/2001 | Nakura et al. ................. 327/117 |
| 6,961,403 | B1* | 11/2005 | Austin et al. .................... 377/80 |
| 7,149,275 | B1 | 12/2006 | Hubbard |
| 2003/0053385 | A1 | 3/2003 | Tobita et al. |
| 2006/0273833 | A1* | 12/2006 | Chen ............................. 327/116 |

OTHER PUBLICATIONS

Wikipedia—Clock Edge http://en.wikipedia.org/wiki/Clock_edge.

* cited by examiner

*Primary Examiner* — Lincoln Donovan
*Assistant Examiner* — Brandon S Cole

(57) ABSTRACT

A frequency divider includes a first frequency divider stage coupled to a clock signal and operative to generate a first frequency divided signal. A second frequency divider stage is coupled to the clock signal and to the first frequency divider stage and is operative to generate a second frequency divided signal. A third frequency divider stage is coupled to the clock signal and to the second frequency divider stage and is configured to generate a third frequency divided signal using only i) the clock signal and ii) the second frequency divided signal so that any transition of the third frequency divided signal occurs at an edge of the clock signal at which the second frequency divided signal does not transition.

18 Claims, 10 Drawing Sheets

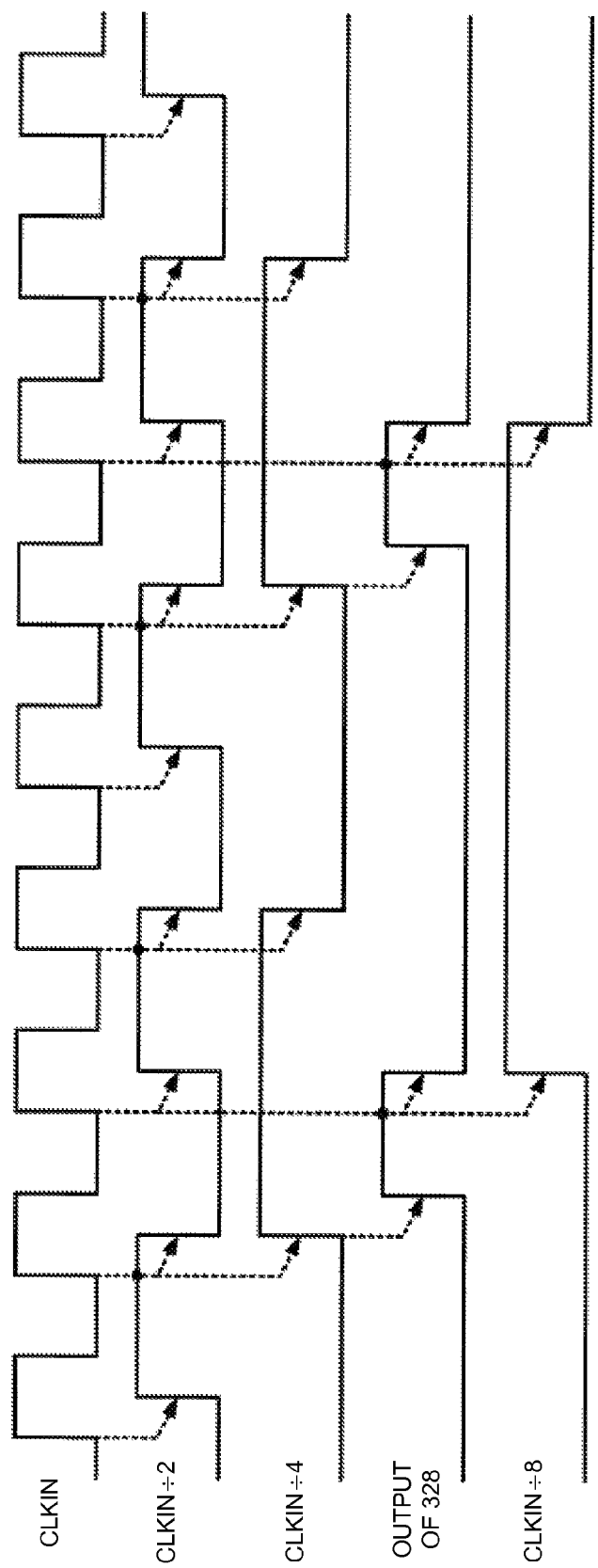

METHOD AND APPARATUS FOR GENERATING FREQUENCY DIVIDED SIGNALS

CROSS-REFERENCES TO RELATED APPLICATIONS

The present application is a continuation of U.S. patent application Ser. No. 11/740,638, entitled "Method and Apparatus for Generating Frequency Divided Signals," filed Apr. 26, 2007, which claims the benefit of U.S. Provisional Application No. 60/831,895, entitled "PIPELINED BINARY FREQUENCY DIVIDER," filed on Jul. 19, 2006. The disclosures of each of the foregoing applications is incorporated herein by reference in its entirety.

FIELD OF TECHNOLOGY

The present disclosure relates generally to digital circuits, and more particularly, to generating frequency divided signals.

DESCRIPTION OF THE RELATED ART

A frequency divider divides an input clock frequency down to some lower clock frequency. A common type of frequency divider, often referred to as a binary frequency divider, divides the input clock frequency down by $2^n$, where n is some integer that is greater than or equal to 1. FIG. 1 is a block diagram of a ripple binary frequency divider (RBFD) 100, a widely-used implementation of a binary frequency divider. The RBFD 100 comprises n stages, where each stage includes a D flip-flop. Although four D flip-flops 104, 108, 112, and 116 are illustrated, there may be n D flip-flops. Each D flip-flop includes a data input (D), a clock input, an output (Q), and a complement output (QN). As is well known to those of ordinary skill in the art, the output Q of a D flip-flop is set to the value of D when some event occurs at the clock input, such as a rising edge or a falling edge. The value of Q will then remain the same until the next occurrence of the clock event. At that point, Q will be set to the then value of D.

In the first stage, an input clock signal (CLKIN) is coupled to the clock input of the D flip-flop 104. QN of the D flip-flop 104 is coupled to the data input of the D flip-flop 104. For each of the other D flip-flops 108, 112, and 116, QN of the D flip-flop is coupled to the data input of the same D flip-flop, and Q from the previous stage is coupled to the clock input. The output of each of the D flip-flops 104, 108, 112, and 116 is a frequency divided signal. In operation, each stage generates a signal having a frequency that is one half that of the clock input to the stage. Thus, the frequency of the output of the $n^{th}$ stage is $(\frac{1}{2})^n$ times the frequency of CLKIN.

FIG. 2 is a block diagram of a synchronous binary frequency divider (SBFD) 150, another implementation of a binary frequency divider. The SBFD 150 is based on a synchronous, i.e., clocked, T flip-flop. Each T flip-flop utilized in the SBFD 150 includes a toggle input (T), a clock input, and an output (Q). Q toggles if T is high when some event occurs at the clock input, such as a rising edge or a falling edge. On the other hand, the output Q will remain unchanged if T is low when the clock event occurs.

The SBFD 150 includes a plurality of stages 154, 158, 162, and 166. Although four stages are illustrated, there may be n stages. Each stage of the SBFD 150 includes a T flip-flop 170, 174, 178, or 182, and each clock input of each of the T flip-flops 170, 174, 178, and 182 is coupled to CLKIN. In the first stage 154, the T input of the T flip-flop 170 is coupled to a high value. In the second stage 158, the output Q of the T flip-flop 170 is coupled to the T input of the T flip-flop 174. For the remaining stages, an output Q of the previous stage's T flip-flop and the input T to the previous stage's T flip-flop are logically ANDed, with the result being provided as the input to T flip-flop of that stage. For example, the stage 162 includes an AND gate 186. The input T and the output Q of the T flip-flop 174 are coupled to inputs of the AND gate 186. An output of the AND gate 186 is coupled to the T input of the T flip-flop 178. With regard to the stage 166, it includes an AND gate 190. An input T and an output Q of a T flip-flop from a previous stage are coupled to inputs of the AND gate 190. An output of the AND gate 190 is coupled to the T input of the T flip-flop 182.

The output of each of the T flip-flops 170, 174, 178, and 182 is a frequency divided signal. In operation, each stage generates a signal having a frequency that is one half that of the clock input to the stage. Thus, the frequency of the output of the $n^{th}$ stage is $(\frac{1}{2})^n$ times the frequency of CLKIN.

Operation of the SBFD 150 will now be described with reference to FIG. 3, which is a signal transition diagram illustrating signals associated with the first three stages of the SBFD 150. In FIG. 3, dotted lines are used to indicate signal transitions that are synchronous with, but delayed with respect to, clock edges in CLKIN. As described above, the T input of the T flip-flop 170 is connected to a high value. Thus, the output Q of the T flip-flop 170 will toggle on every occurrence of a particular event (e.g., every rising edge or every falling edge) in the CLKIN signal. Thus, the first stage 154 generates the output CLKIN÷2, which is high in every other clock period, i.e., its frequency is ½ that of CLKIN.

The output of the first stage 154 is connected directly to the T input of the T flip-flop 174 of the second stage 158. Thus, the output Q of the T flip-flop 174 will toggle on every occurrence of a particular event (e.g., every rising edge or every falling edge) in the CLKIN signal when the signal CLKIN÷2 is high. Thus, the second stage 158 generates the output CLKIN÷4, which is high on every other CLKIN÷2 period, i.e., its frequency is ¼ that of the CLKIN.

The T input of the T flip-flop 178 of the third stage 162 is high only when both the input and the output of the T flip-flop 174 of the second stage 158 are high. Thus the output of the T flip-flop 178 toggles on every fourth CLKIN period, i.e., its frequency is ⅛ that of the CLKIN.

SUMMARY OF THE DISCLOSURE

In one embodiment, a method of dividing a frequency of a clock signal includes generating a first frequency divided signal based on a clock signal. The method also includes detecting one of rising edges or falling edges in the first frequency divided signal, and generating an edge detection signal that includes a pulse for one of each rising edge or each falling edge in the first frequency divided signal. Additionally, the method includes generating a second frequency divided signal based on the edge detection signal.

In another embodiment, a frequency divider comprises a first frequency divider stage having an input and an output, the input of the first frequency divider stage coupled to a clock signal. The frequency divider additionally comprises a second frequency divider stage, which includes an edge detector having an input coupled to the output of the first frequency divider stage, the edge detector configured to generate a signal at an output of the edge detector upon detecting one of each rising edge or each falling edge at the input of the edge detector. The second frequency divider stage also includes a frequency divider circuit having an input and an output, the input of the frequency divider circuit coupled to the output of the edge detector.

In yet another embodiment, a frequency divider stage comprises an edge detector having a data input, a clock input, and an output, the edge detector configured to generate a signal at the output of the edge detector upon detecting one of each rising edge or each falling edge at the data input of the edge detector. The frequency divider stage also comprises a frequency divider circuit having a data input, a clock input, and an output, the data input of the frequency divider circuit coupled to the output of the edge detector.

In still another embodiment, a method of dividing a frequency of a clock signal includes generating a first frequency divided signal using a first frequency divider stage driven by a clock signal. The method additionally includes generating a second frequency divided signal using a second frequency divider stage driven by the clock signal, wherein the second frequency divider stage includes an input coupled to the first frequency divided signal and a synchronous output corresponding to the second frequency divided signal. Further, the method includes generating a third frequency divided signal using a third frequency divider stage driven by the clock signal, wherein the third frequency divider stage includes only one data input, the one data input coupled only to the synchronous output of the second frequency divider stage.

In yet another embodiment, a frequency divider comprises a first frequency divider stage having a clock input and an output. The clock input of the first frequency divider stage is coupled to a clock signal. Also, the frequency divider comprises a second frequency divider stage having a clock input, a data input, and a synchronous output. The clock input of the second frequency divider stage is coupled to the clock signal. The data input of the second frequency divider stage is coupled to the output of the first frequency divider stage. Additionally, the frequency divider comprises a third frequency divider stage having a clock input, only one data input, and an output. The clock input of the third frequency divider stage is coupled to the clock signal. The only data input of the third frequency divider stage is connected to the synchronous output of the second frequency divider stage.

BRIEF DESCRIPTION OF THE DRAWINGS

FIG. 7 is a signal diagram illustrating signals of the frequency divider of FIG. 6;

DETAILED DESCRIPTION

Figure 4:
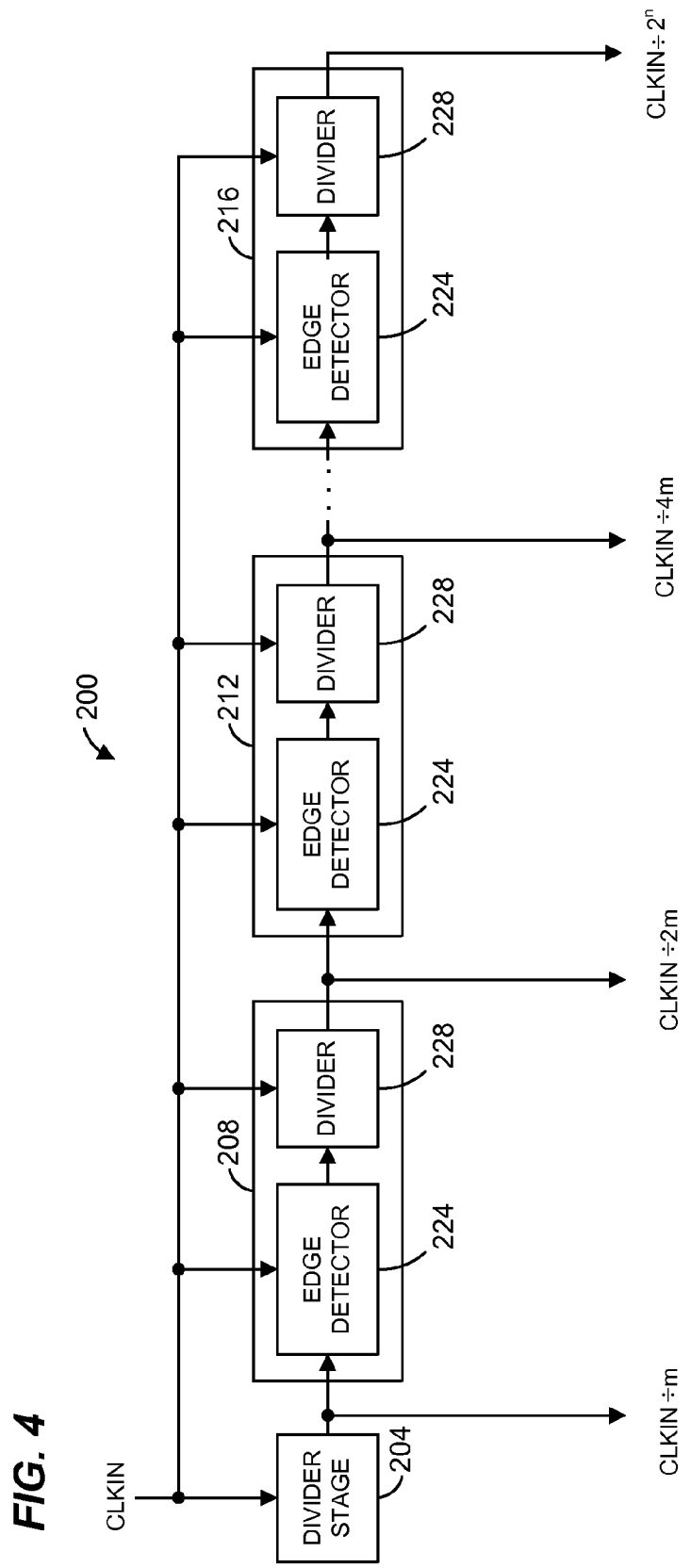
FIG. 4 is a block diagram of an example frequency divider.

FIG. 4 is a block diagram of an example frequency divider 200 that includes a first divider stage 204 and one or more other divider stages 208, 212, 216. Although FIG. 4 illustrates four divider stages (e.g., divider stages 204, 208, 212, and 216), one of ordinary skill in the art will recognize that other numbers of divider stages may be utilized. For example, a frequency divider may utilize only two or three divider stages, or it may utilize more than four divider stages. Each of the divider stages 204, 208, 212, and 216 receives a clock signal CLKIN.

Figure 1:
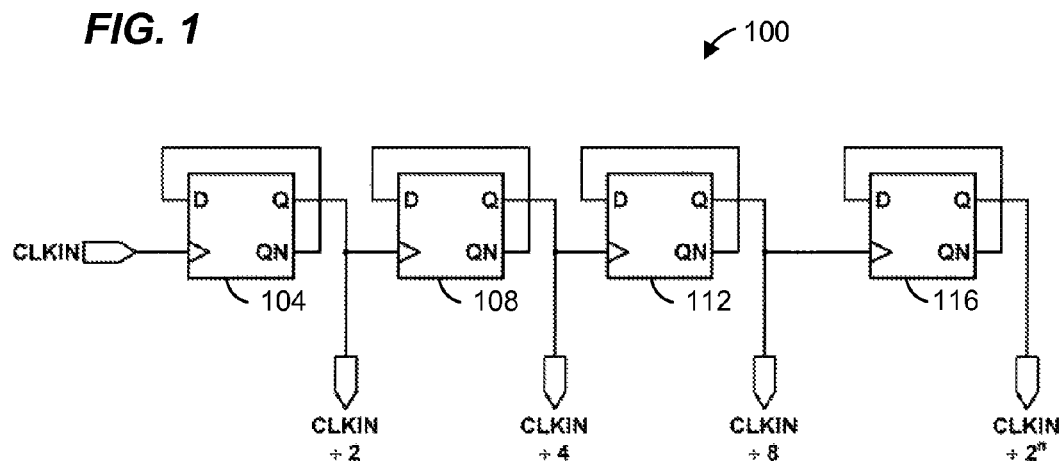
FIG. 1 is a block diagram of a prior art frequency divider.
Figure 2:
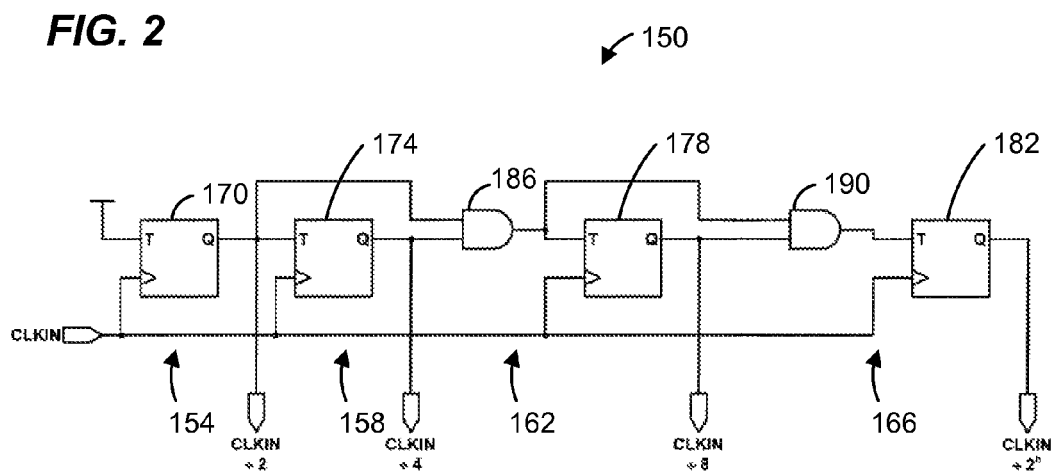
FIG. 2 is a block diagram of another prior art frequency divider.
Figure 3:
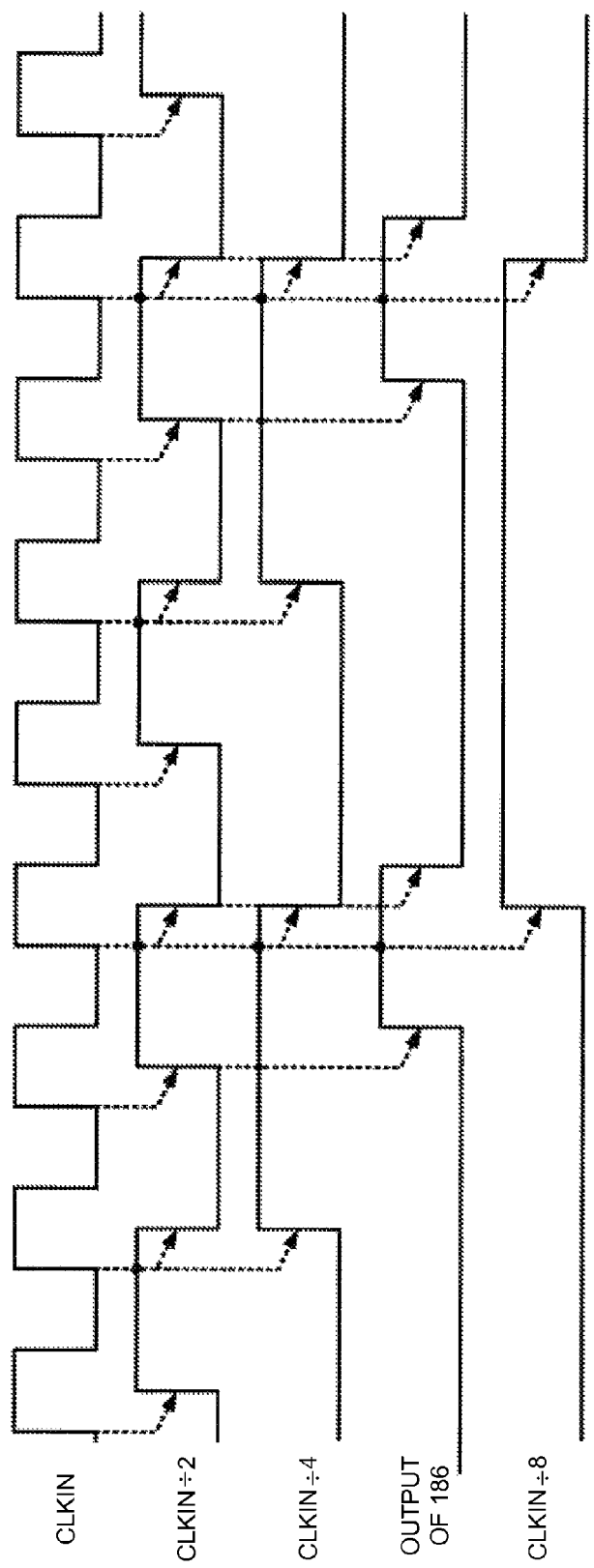
FIG. 3 is a signal diagram illustrating signals of the frequency divider of FIG. 2.

The divider stage 204 generates an output signal CLKIN÷m, where m is an integer. The output signal CLKIN÷m has a frequency that is 1/m that of CLKIN. Additionally, the output signal CLKIN÷m includes edges that are detectable (e.g., rising edges and/or falling edges). The divider stage 204 may itself include multiple divider stages. For example, the divider stage 204 may include two divide-by-two divider stages coupled together in series so that the divider stage 204 generates an output signal that is ¼ that of CLKIN. If the divider stage 204 is to generate an output signal that is ¼ that of CLKIN, it may comprise two D flip-flops coupled in series such as the D flip-flops 104 and 108 of FIG. 1, for example. As another example, if the divider stage 204 is to generate an output signal that is ¼ that of CLKIN, it may comprise two T flip-flops coupled in series such as the T flip-flops 170 and 174 of FIG. 2.

Each of the other divider stages 208, 212, 216 may include an edge detector and a frequency divider circuit. Referring to divider stage 208, for instance, it includes an edge detector 224 and a frequency divider circuit 228. The edge detector 224 includes a data input that is coupled to the output of the previous divider stage, and a clock input coupled to CLKIN. The edge detector 224 generates an output signal that is coupled to a data input of the frequency divider circuit 228. The frequency divider circuit 228 also includes a clock input coupled to CLKIN. The frequency divider circuit 228 generates an output signal having a frequency one half of that of the output of the previous stage.

In operation, the edge detector 224 detects particular events in the signal coupled to its data input, and generates at its output in response to each detected event a pulse. The pulse length may be approximately equal to one period of CLKIN, for example. The detected events may be, for example, each rising edge or each falling edge. The frequency divider circuit 228 receives the output of the edge detector 224 and synchronously changes the state of its output in response to each pulse, i.e., the state of its output is changed synchronous with CLKIN.

Figure 5:
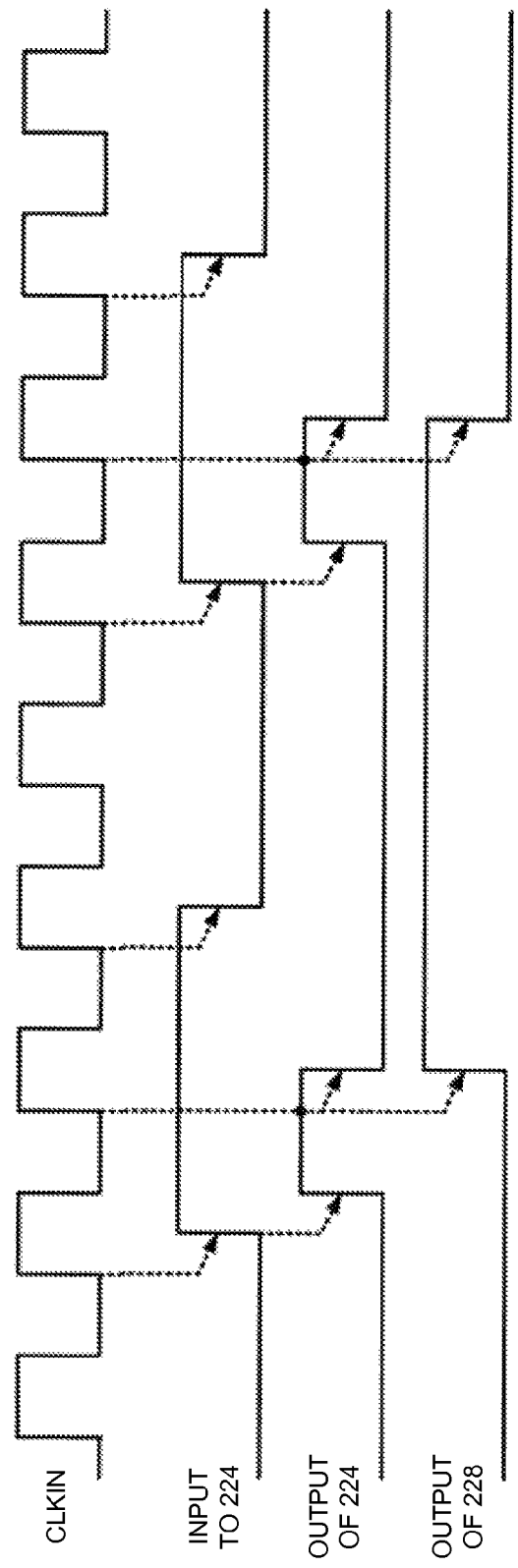
FIG. 5 is a signal diagram illustrating signals of the frequency divider of FIG. 4.

FIG. 5 is a signal transition diagram illustrating an example of signal transitions in the frequency divider 200. In particular, the diagram of FIG. 5 illustrates signals associated with the divider stage 208. In FIG. 5, dotted lines are used to indicate signal transitions that correspond to, but are delayed with respect to, events in other signals. In the example illustrated in FIG. 5, it is assumed that the divider stage 204 is a divide-by-4 stage. Thus, the input to the edge detector 224 has a frequency ¼ that of CLKIN. Of course, it is to be understood that the divider stage 204 in general could be a divide-by-m stage, where m is an integer. As indicated in FIG. 5, transitions in the signal that is coupled to the input to the edge detector 224 are synchronous with, but delayed with respect to, rising edges of CLKIN. Of course, it is to be understood that transitions in the signal that is coupled to the input to the edge detector 224 may be synchronous with other events in CLKIN, such as falling edges.

In the example of FIG. 5, the edge detector 224 generates pulses that correspond to each rising edge at the input to the edge detector 224, and the pulses each have a length of approximately one clock period. As indicated in FIG. 5, rising edges of the output of the edge detector 224 correspond to, and are delayed with respect to, rising edges in the signal coupled to the input to the edge detector 224. Falling edges of the output of the edge detector 224 correspond to, and are delayed with respect to, rising edges in the CLKIN. The frequency divider circuit 228 synchronously changes the state of its output in response to each pulse generated by the detector 224. In particular, the state of the output is changed synchronous with, but delayed with respect to, a rising edge of CLKIN. It is to be understood that, in some implementations, the edge detector 224 could generate pulses that correspond to some other event in the input signal, such as falling edges. Similarly, the edge detector 224 could generate pulses such that the falling edges of the pulses are synchronous with some other event in CLKIN, such as falling edges. In yet another variation, the frequency divider circuit 228 may change the state of its output synchronous with some other event in CLKIN, such as a falling edge of CLKIN. In still another variation, a frequency divider could be configured such that all of the signals in FIG. 5 are inverted. For example, the pulse generated by the edge detector 224 could be an inverted pulse.

The divider stages 212 and 216 may operate in a manner similar to the operation of divider stage 208. Although the one or more other divider stages 208, 212, 216 are illustrated as being connected in series, one of ordinary skill in the art will recognize that other types of divider stages could be interposed between the one or more other divider stages 208, 212, 216. As just one example, a divider stage such as the divider stage 162 of FIG. 2 could be connected in series between the divider stage 208 and the divider stage 212. For example, the input to the divider stage 208 and the output of the divider stage 208 could be coupled to the AND gate 186. Also, the output of the T flip-flop 178 could be coupled to the input of the divider stage 212. One of ordinary skill in the art will recognize many other variations.

Figure 6:
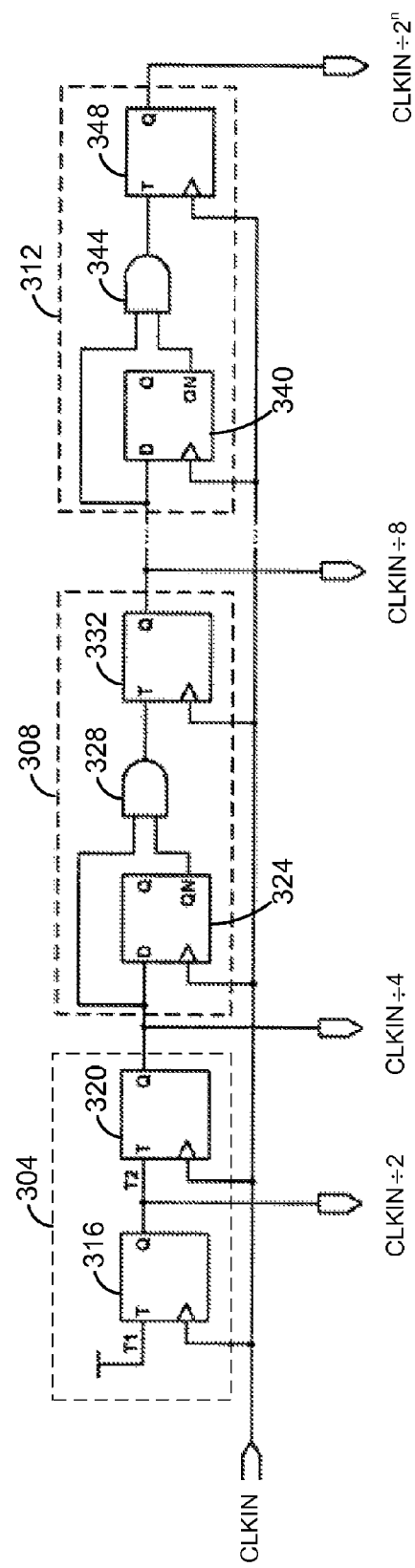
FIG. 6 is a block diagram of another example frequency divider.

FIG. 6 is a block diagram of an example frequency divider 300. The frequency divider 300 is one possible implementation of the frequency divider 200 of FIG. 4. For instance, the frequency divider 300 includes a first divider stage 304 that may correspond to the divider stage 204 of FIG. 4. The frequency divider 300 also includes one or more other divider stages 308, 312, that may correspond to the divider stages 208, 216, respectively, for example. Although FIG. 6 illustrates three divider stages (e.g., divider stages 304, 308 and 312), one of ordinary skill in the art will recognize that other numbers of divider stages may be utilized. For example, other implementations of a frequency divider may utilize only two divider stages, or more than three divider stages. Each of the divider stages 304, 308, and 312 receives a clock signal CLKIN.

The divider stage 304 generates an output signal CLKIN 4, which has a frequency that is ¼ that of CLKIN. The divider stage 304 comprises two divider components in series. In particular, the divider stage 304 includes a T flip-flop 316 and a T flip-flop 320. A clock input of the T flip-flop 316 is coupled to CLKIN, and a T input of the T flip-flop 316 is coupled to a high value. Thus, the output Q of the T flip-flop 316 will toggle on every occurrence of a particular event (e.g., every rising edge or every falling edge) in the CLKIN signal. As a result, the output CLKIN÷2 is high in every other period of CLKIN, i.e., its frequency is ½ that of CLKIN.

The output of the T flip-flop 316 is coupled to a T input of the T flip-flop 320, and a clock input of the T flip-flop 320 is coupled to CLKIN. Thus, the output Q of the T flip-flop 320 will toggle on every occurrence of a particular event (e.g., every rising edge or every falling edge) in the CLKIN signal when the signal CLKIN is high. As a result, the output CLKIN÷4 has a frequency that is ¼ that of the CLKIN.

It is to be understood that the divider stage 304 could be modified. For example, it could be modified to divide the frequency of CLKIN by some integer other than 4. As another example, it could comprise two or more D flip-flops coupled in series such as the D flip-flops 104 and 108 of FIG. 1. One of ordinary skill in the art will recognize many other variations.

Each of the other divider stages 308, 312, may include a D flip-flop, an AND gate, and a T flip-flop. Referring to divider stage 308, for instance, it includes a D flip-flop 324, an AND gate 328, and a T flip-flop 332. A data input of the D flip-flop 324 is coupled to the output of the previous divider stage. A clock input of the D flip-flop 324 is coupled to CLKIN. The D flip-flop 324 generates a complement output (QN). A first input of the AND gate 328 is coupled to the data input of the D flip-flop 324, and a second input of the AND gate 328 is coupled to the QN output of the D flip-flop 324. The D flip-flop 324 and the AND gate 328 form an edge detector that generates an output signal having a pulse each time a particular event is detected in the signal coupled to the data input of the D flip-flop 324. For example, an output of the AND gate 328 may include a pulse having a length approximately equal to one period of CLKIN each time a rising edge occurs in the signal coupled to the data input of the D flip-flop 324.

The output of the AND gate 328 is coupled to a T input of the T flip-flop 332. A clock input of the T flip-flop 332 is coupled to CLKIN. The T flip-flop 332 acts as a frequency divider circuit. In particular, the T flip-flop 332 receives the output of the AND gate 328 and, each time both the output of the AND gate 328 is a particular value (e.g., a high value) and a particular event occurs in CLKIN (e.g., a rising edge or a falling edge), the T flip-flop 332 toggles its output (Q). Thus, the output Q of the T flip-flop 332 will have a frequency ½ that of the data input to the D flip-flop 324.

The divider stage 312 may operate in the same manner as the divider stage 308. For instance, the divider stage 312 includes a D flip-flop 340, an AND gate 344, and a T flip-flop 348. A data input of the D flip-flop 340 is coupled to the output of the previous divider stage. A clock input of the D flip-flop 340 is coupled to CLKIN. The D flip-flop 340 generates a complement output (QN). A first input of the AND gate 344 is coupled to the data input of the D flip-flop 340, and a second input of the AND gate 344 is coupled to the QN output of the D flip-flop 340. The D flip-flop 340 and the AND gate 344 form an edge detector that generates an output signal having a pulse each time a particular event is detected in the signal coupled to the data input of the D flip-flop 340. For example, an output of the AND gate 344 may include a pulse having a length approximately equal to one period of CLKIN each time a rising edge occurs in the signal coupled to the data input of the D flip-flop 340.

The output of the AND gate 344 is coupled to a T input of the T flip-flop 348. A clock input of the T flip-flop 348 is coupled to CLKIN. The T flip-flop 348 acts as a frequency divider circuit. In particular, the T flip-flop 348 receives the output of the AND gate 344 and, each time both the output of the AND gate 344 is a particular value (e.g., a high value) and a particular event occurs in CLKIN (e.g., a rising edge or a falling edge), the T flip-flop 348 toggles its output (Q). Thus, the output Q of the T flip-flop 348 will have a frequency ½ that of the data input to the D flip-flop 340.

FIG. 7 is a signal transition diagram illustrating an example of signal transitions in the frequency divider 300. In particular, the diagram of FIG. 7 illustrates the CLKIN÷2 signal, the CLKIN÷4 signal, the CLKIN÷8, and the signal generated by the AND gate 328. In FIG. 7, dotted lines are used to indicate signal transitions that correspond to, but are delayed with respect to, events in other signals.

In the example of FIG. 7, the T flip-flop 320 generates the signal CLKIN 4, which has a frequency that is ¼ that of the CLKIN. The signal CLKIN÷4 is coupled to the edge detector that comprises the D flip-flop 324 and the AND gate 328. The output of the AND gate 328 includes pulses that correspond to each rising edge at the input to the D flip-flop 324, and the pulses each have a length of approximately one clock period. As indicated in FIG. 7, rising edges of the output of the AND gate 328 correspond to, and are delayed with respect to, rising edges in CLKIN÷4. Falling edges of the output of the AND gate 328 correspond to, and are delayed with respect to, rising edges in the CLKIN. The T flip-flop 332 synchronously changes the state of its output in response to each pulse generated by the AND gate 328. In particular, the state of the output is changed synchronous with, but delayed with respect to, a rising edge of CLKIN. It is to be understood that, in some implementations, the T flip-flop 332 may change the state of its output synchronous with some other event in CLKIN, such as a falling edge of CLKIN. In another variation, a frequency divider could be configured such that all of the signals in FIG. 7 are inverted. For example, the pulse generated by the AND gate 328 could be an inverted pulse.

The divider stage 312 may operate in a manner similar to the operation of divider stage 308. Although the one or more other divider stages 308, 312 are illustrated as being connected in series, one of ordinary skill in the art will recognize that other types of divider stages could be interposed between the one or more other divider stages 308, 312. As just one example, a divider stage such as the divider stage 162 of FIG. 2 could be connected in series between the divider stage 308 and the divider stage 312. For example, the input to the divider stage 308 and the output of the divider stage 308 could be coupled to the AND gate 186. Also, the output of the T flip-flop 178 could be coupled to the input of the divider stage 312. One of ordinary skill in the art will recognize many other variations.

Although the divider stages 308 and 312 include D flip-flops with a complement output (QN), similar divider stages could be implemented with D flip-flops that do not generate a complement output (QN). For example, a D flip-flop that only generates an output Q could be used in conjunction with an inverter. An input of the inverter could be coupled to the output Q, and the output of the inverter could be coupled to the T input of the T flip-flop of the divider stage.

Referring now to FIGS. 4 and 6, it can be seen that, in at least some implementations of a frequency divider, the only data input of each of at least some later divider stages is coupled only to the frequency divided output generated by the previous divider stage. This is unlike the prior art frequency divider 150 of FIG. 2. In particular, the later stages of the frequency divider 150 each have two inputs: the two inputs to the stage's AND gate. Moreover, one of these inputs is coupled to the output of the previous stage's AND gate. Thus, these divider stages include an input that is not the frequency divided output generated by the previous divider stage. This leads to a drawback of the frequency divider 150. In particular, for the $n^{th}$ stage 166 to toggle its output, the outputs of all the preceding n−1 stages must be high. This condition requires ANDing together the outputs of the n−1 stages preceding the $n^{th}$ stage through the use of n−2 AND gates that are connected in series. These n−2 AND gates propagate the outputs of all the stages preceding the $n^{th}$ stage, including the first stage, up to stage n. Thus, the delay through the series-connected AND gates increases with the number of stages n. If n is large, the path through the n−2 AND gates may become a critical path that limits the maximum frequency divisor, i.e., the maximum modulus length.

In at least some implementations of a frequency divider such as the frequency divider 300 of FIG. 6, changes in a stage output may propagate through the chain of later stages at a rate of one stage per clock. As a result, large numbers of stages will not toggle at the same time. On the other hand, with the prior art frequency divider 150 of FIG. 2, when an output of a stage changes, the outputs of all of the preceding stages change as well. Thus, large numbers of stages will toggle at the same time. As a result, this may cause problems related to switching noise. Table 1 lists stage outputs for a frequency divider, such as the frequency divider 300 of FIG. 6, having six stages. The outputs of the six stages may correspond to CLKIN÷2, CLKIN÷4, CLKIN÷8, CLKIN÷16, CLKIN÷32, CLKIN÷64, for example. Table 2 lists stage outputs for a frequency divider, such as the frequency divider 150 of FIG. 2, having six stages. The outputs of the six stages may correspond to CLKIN÷2, CLKIN÷4, CLKIN÷8, CLKIN÷16, CLKIN÷32, CLKIN÷64, for example. As can be seen in Table 2 (corresponding to a frequency divider such as the frequency divider 150), there are times at which large numbers of stage outputs change state, such as the transition from clock period 31 to clock period 32 or from clock period 63 to clock period 64. But as can be seen in Table 1 (corresponding to a frequency divider, such as the frequency divider 300), large numbers of stage outputs do not change state at the same time.

TABLE 1

| Clock Period | Outputs of Stages | | | | | |
|---|---|---|---|---|---|---|
| | Stage 1 | Stage 2 | Stage 3 | Stage 4 | Stage 5 | Stage 6 |
| 0 | 0 | 0 | 0 | 0 | 0 | 0 |
| 1 | 1 | 0 | 0 | 0 | 0 | 0 |
| 2 | 0 | 1 | 0 | 0 | 0 | 0 |
| 3 | 1 | 1 | 1 | 0 | 0 | 0 |
| 4 | 0 | 0 | 1 | 1 | 0 | 0 |
| 5 | 1 | 0 | 1 | 1 | 1 | 0 |
| 6 | 0 | 1 | 1 | 1 | 1 | 1 |
| 7 | 1 | 1 | 0 | 1 | 1 | 1 |
| 8 | 0 | 0 | 0 | 1 | 1 | 1 |
| 9 | 1 | 0 | 0 | 1 | 1 | 1 |
| 10 | 0 | 1 | 0 | 1 | 1 | 1 |
| 11 | 1 | 1 | 1 | 1 | 1 | 1 |
| 12 | 0 | 0 | 1 | 0 | 1 | 1 |
| 13 | 1 | 0 | 1 | 0 | 1 | 1 |
| 14 | 0 | 1 | 1 | 0 | 1 | 1 |

TABLE 1-continued

| Clock Period | Stage 1 | Stage 2 | Stage 3 | Stage 4 | Stage 5 | Stage 6 |
|---|---|---|---|---|---|---|
| 15 | 1 | 1 | 0 | 0 | 1 | 1 |
| 16 | 0 | 0 | 0 | 0 | 1 | 1 |
| 17 | 1 | 0 | 0 | 0 | 1 | 1 |
| 18 | 0 | 1 | 0 | 0 | 1 | 1 |
| 19 | 1 | 1 | 1 | 0 | 1 | 1 |
| 20 | 0 | 0 | 1 | 1 | 1 | 1 |
| 21 | 1 | 0 | 1 | 1 | 0 | 1 |
| 22 | 0 | 1 | 1 | 1 | 0 | 1 |
| 23 | 1 | 1 | 0 | 1 | 0 | 1 |
| 24 | 0 | 0 | 0 | 1 | 0 | 1 |
| 25 | 1 | 0 | 0 | 1 | 0 | 1 |
| 26 | 0 | 1 | 0 | 1 | 0 | 1 |
| 27 | 1 | 1 | 1 | 1 | 0 | 1 |
| 28 | 0 | 0 | 1 | 0 | 0 | 1 |
| 29 | 1 | 0 | 1 | 0 | 0 | 1 |
| 30 | 0 | 1 | 1 | 0 | 0 | 1 |
| 31 | 1 | 1 | 0 | 0 | 0 | 1 |
| 32 | 0 | 0 | 0 | 0 | 0 | 1 |
| 33 | 1 | 0 | 0 | 0 | 0 | 1 |
| 34 | 0 | 1 | 0 | 0 | 0 | 1 |
| 35 | 1 | 1 | 1 | 0 | 0 | 1 |
| 36 | 0 | 0 | 1 | 1 | 0 | 1 |
| 37 | 1 | 0 | 1 | 1 | 1 | 1 |
| 38 | 0 | 1 | 1 | 1 | 1 | 0 |
| 39 | 1 | 1 | 0 | 1 | 1 | 0 |
| 40 | 0 | 0 | 0 | 1 | 1 | 0 |
| 41 | 1 | 0 | 0 | 1 | 1 | 0 |
| 42 | 0 | 1 | 0 | 1 | 1 | 0 |
| 43 | 1 | 1 | 1 | 1 | 1 | 0 |
| 44 | 0 | 0 | 1 | 0 | 1 | 0 |
| 45 | 1 | 0 | 1 | 0 | 1 | 0 |
| 46 | 0 | 1 | 1 | 0 | 1 | 0 |
| 47 | 1 | 1 | 0 | 0 | 1 | 0 |
| 48 | 0 | 0 | 0 | 0 | 1 | 0 |
| 49 | 1 | 0 | 0 | 0 | 1 | 0 |
| 50 | 0 | 1 | 0 | 0 | 1 | 0 |
| 51 | 1 | 1 | 1 | 0 | 1 | 0 |
| 52 | 0 | 0 | 1 | 1 | 1 | 0 |
| 53 | 1 | 0 | 1 | 1 | 0 | 0 |
| 54 | 0 | 1 | 1 | 1 | 0 | 0 |
| 55 | 1 | 1 | 0 | 1 | 0 | 0 |
| 56 | 0 | 0 | 0 | 1 | 0 | 0 |
| 57 | 1 | 0 | 0 | 1 | 0 | 0 |
| 58 | 0 | 1 | 0 | 1 | 0 | 0 |
| 59 | 1 | 1 | 1 | 1 | 0 | 0 |
| 50 | 0 | 0 | 1 | 0 | 0 | 0 |
| 61 | 1 | 0 | 1 | 0 | 0 | 0 |
| 62 | 0 | 1 | 1 | 0 | 0 | 0 |
| 63 | 1 | 1 | 0 | 0 | 0 | 0 |
| 64 | 0 | 0 | 0 | 0 | 0 | 0 |
| 65 | 1 | 0 | 0 | 0 | 0 | 0 |
| 66 | 0 | 1 | 0 | 0 | 0 | 0 |
| 67 | 1 | 1 | 1 | 0 | 0 | 0 |
| 68 | 0 | 0 | 1 | 1 | 0 | 0 |
| 69 | 1 | 0 | 1 | 1 | 1 | 0 |
| 70 | 0 | 1 | 1 | 1 | 1 | 1 |
| 71 | 1 | 1 | 0 | 1 | 1 | 1 |
| 72 | 0 | 0 | 0 | 1 | 1 | 1 |
| 73 | 1 | 0 | 0 | 1 | 1 | 1 |
| 74 | 0 | 1 | 0 | 1 | 1 | 1 |
| 75 | 1 | 1 | 1 | 1 | 1 | 1 |
| 76 | 0 | 0 | 1 | 0 | 1 | 1 |
| 77 | 1 | 0 | 1 | 0 | 1 | 1 |
| 78 | 0 | 1 | 1 | 0 | 1 | 1 |
| 79 | 1 | 1 | 0 | 0 | 1 | 1 |

TABLE 2

| Clock Period | Stage 1 | Stage 2 | Stage 3 | Stage 4 | Stage 5 | Stage 6 |
|---|---|---|---|---|---|---|
| 0 | 0 | 0 | 0 | 0 | 0 | 0 |
| 1 | 1 | 0 | 0 | 0 | 0 | 0 |
| 2 | 0 | 1 | 0 | 0 | 0 | 0 |
| 3 | 1 | 1 | 0 | 0 | 0 | 0 |
| 4 | 0 | 0 | 1 | 0 | 0 | 0 |
| 5 | 1 | 0 | 1 | 0 | 0 | 0 |
| 6 | 0 | 1 | 1 | 0 | 0 | 0 |
| 7 | 1 | 1 | 1 | 0 | 0 | 0 |
| 8 | 0 | 0 | 0 | 1 | 0 | 0 |
| 9 | 1 | 0 | 0 | 1 | 0 | 0 |
| 10 | 0 | 1 | 0 | 1 | 0 | 0 |
| 11 | 1 | 1 | 0 | 1 | 0 | 0 |
| 12 | 0 | 0 | 1 | 1 | 0 | 0 |
| 13 | 1 | 0 | 1 | 1 | 0 | 0 |
| 14 | 0 | 1 | 1 | 1 | 0 | 0 |
| 15 | 1 | 1 | 1 | 1 | 0 | 0 |
| 16 | 0 | 0 | 0 | 0 | 1 | 0 |
| 17 | 1 | 0 | 0 | 0 | 1 | 0 |
| 18 | 0 | 1 | 0 | 0 | 1 | 0 |
| 19 | 1 | 1 | 0 | 0 | 1 | 0 |
| 20 | 0 | 0 | 1 | 0 | 1 | 0 |
| 21 | 1 | 0 | 1 | 0 | 1 | 0 |
| 22 | 0 | 1 | 1 | 0 | 1 | 0 |
| 23 | 1 | 1 | 1 | 0 | 1 | 0 |
| 24 | 0 | 0 | 0 | 1 | 1 | 0 |
| 25 | 1 | 0 | 0 | 1 | 1 | 0 |
| 26 | 0 | 1 | 0 | 1 | 1 | 0 |
| 27 | 1 | 1 | 0 | 1 | 1 | 0 |
| 28 | 0 | 0 | 1 | 1 | 1 | 0 |
| 29 | 1 | 0 | 1 | 1 | 1 | 0 |
| 30 | 0 | 1 | 1 | 1 | 1 | 0 |
| 31 | 1 | 1 | 1 | 1 | 1 | 0 |
| 32 | 0 | 0 | 0 | 0 | 0 | 1 |
| 33 | 1 | 0 | 0 | 0 | 0 | 1 |
| 34 | 0 | 1 | 0 | 0 | 0 | 1 |
| 35 | 1 | 1 | 0 | 0 | 0 | 1 |
| 36 | 0 | 0 | 1 | 0 | 0 | 1 |
| 77 | 1 | 0 | 1 | 0 | 0 | 1 |
| 38 | 0 | 1 | 1 | 0 | 0 | 1 |
| 39 | 1 | 1 | 1 | 0 | 0 | 1 |
| 40 | 0 | 0 | 0 | 1 | 0 | 1 |
| 41 | 1 | 0 | 0 | 1 | 0 | 1 |
| 42 | 0 | 1 | 0 | 1 | 0 | 1 |
| 43 | 1 | 1 | 0 | 1 | 0 | 1 |
| 44 | 0 | 0 | 1 | 1 | 0 | 1 |
| 45 | 1 | 0 | 1 | 1 | 0 | 1 |
| 46 | 0 | 1 | 1 | 1 | 0 | 1 |
| 47 | 1 | 1 | 1 | 1 | 0 | 1 |
| 48 | 0 | 0 | 0 | 0 | 1 | 1 |
| 49 | 1 | 0 | 0 | 0 | 1 | 1 |
| 50 | 0 | 1 | 0 | 0 | 1 | 1 |
| 51 | 1 | 1 | 0 | 0 | 1 | 1 |
| 52 | 0 | 0 | 1 | 0 | 1 | 1 |
| 53 | 1 | 0 | 1 | 0 | 1 | 1 |
| 54 | 0 | 1 | 1 | 0 | 1 | 1 |
| 55 | 1 | 1 | 1 | 0 | 1 | 1 |
| 56 | 0 | 0 | 0 | 1 | 1 | 1 |
| 57 | 1 | 0 | 0 | 1 | 1 | 1 |
| 58 | 0 | 1 | 0 | 1 | 1 | 1 |
| 59 | 1 | 1 | 0 | 1 | 1 | 1 |
| 50 | 0 | 0 | 1 | 1 | 1 | 1 |
| 61 | 1 | 0 | 1 | 1 | 1 | 1 |
| 62 | 0 | 1 | 1 | 1 | 1 | 1 |
| 63 | 1 | 1 | 1 | 1 | 1 | 1 |
| 64 | 0 | 0 | 0 | 0 | 0 | 0 |
| 65 | 1 | 0 | 0 | 0 | 0 | 0 |
| 66 | 0 | 1 | 0 | 0 | 0 | 0 |
| 67 | 1 | 1 | 0 | 0 | 0 | 0 |
| 68 | 0 | 0 | 1 | 0 | 0 | 0 |
| 69 | 1 | 0 | 1 | 0 | 0 | 0 |
| 70 | 0 | 1 | 1 | 0 | 0 | 0 |
| 71 | 1 | 1 | 1 | 0 | 0 | 0 |
| 72 | 0 | 0 | 0 | 1 | 0 | 0 |
| 73 | 1 | 0 | 0 | 1 | 0 | 0 |
| 74 | 0 | 1 | 0 | 1 | 0 | 0 |
| 75 | 1 | 1 | 0 | 1 | 0 | 0 |

TABLE 2-continued

| Clock Period | Outputs of Stages | | | | | |
|---|---|---|---|---|---|---|
| | Stage 1 | Stage 2 | Stage 3 | Stage 4 | Stage 5 | Stage 6 |
| 76 | 0 | 0 | 1 | 1 | 0 | 0 |
| 77 | 1 | 0 | 1 | 1 | 0 | 0 |
| 78 | 0 | 1 | 1 | 1 | 0 | 0 |
| 79 | 1 | 1 | 1 | 1 | 0 | 0 |

A frequency divider such as described above may be utilized in a variety of devices that require the generation of a frequency divided signal. As just a few examples, such a frequency divider may be useful for implementing a phase-lock loop (PLL), a multiple output binary divider, or any binary frequency divider requiring low sensitivity to supply noise. More generally, such a frequency divider may be utilized in a variety of electronic devices such as communication devices, computation devices, storage devices, networking devices, measurement devices, etc. Referring now to FIGS. 8A-8G, a few specific examples of devices that may utilize a frequency divider such as described above will be described.

Figure 8A:
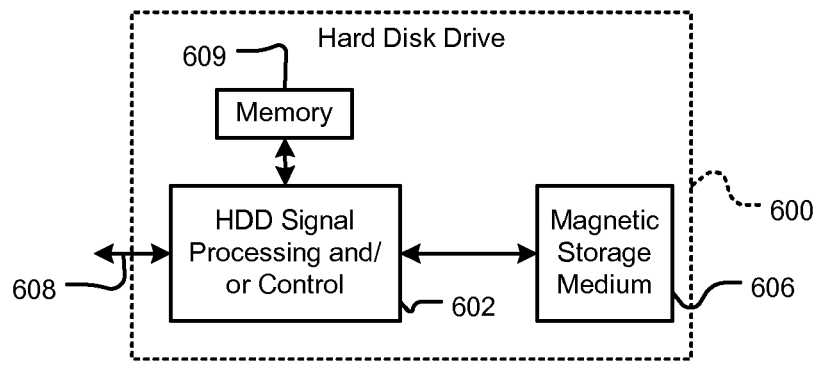
FIG. 8A is a block diagram of a hard disk drive system that may utilize a frequency divider such as the frequency divider of FIG. 4 or the frequency divider of FIG. 6.

For example, referring to FIG. 8A, a hard disk drive 600 may include a frequency divider, which may be implemented by signal processing and/or control circuits, which are generally identified in FIG. 8A at 602. In some implementations, signal processing and/or control circuit 602 and/or other circuits (not shown) in HDD 600 may process data, perform coding and/or encryption, perform calculations, and/or format data that is output to and/or received from a magnetic storage medium 606.

HDD 600 may communicate with a host device (not shown) such as a computer, mobile computing devices such as personal digital assistants, cellular phones, media or MP3 players and the like, and/or other devices via one or more wired or wireless communication links 608. HDD 600 may be connected to memory 609, such as random access memory (RAM), a low latency nonvolatile memory such as flash memory, read only memory (ROM) and/or other suitable electronic data storage.

Figure 8B:
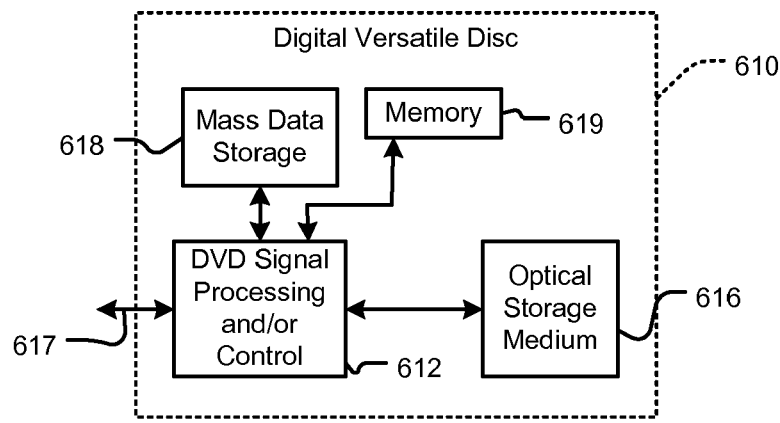
FIG. 8B is a block diagram of a digital versatile drive system that may utilize a frequency divider such as the frequency divider of FIG. 4 or the frequency divider of FIG. 6.
Figure 8C:
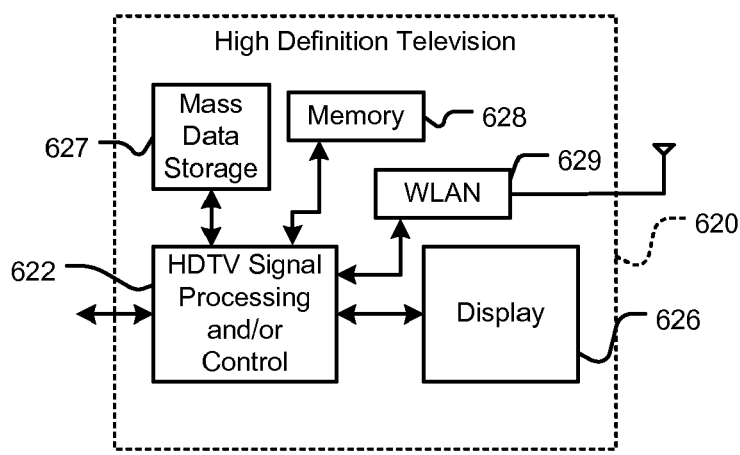
FIG. 8C is a block diagram of a high definition television that may utilize a frequency divider such as the frequency divider of FIG. 4 or the frequency divider of FIG. 6.

Referring now to FIG. 8B, a frequency divider may be utilized in a digital versatile disc (DVD) drive 610. The frequency divider may be implemented by either or both signal processing and/or control circuits, which are generally identified in FIG. 8B at 612, and/or mass data storage 618 of DVD drive 610. Signal processing and/or control circuit 612 and/or other circuits (not shown) in DVD 610 may process data, perform coding and/or encryption, perform calculations, and/or format data that is read from and/or data written to an optical storage medium 616. In some implementations, signal processing and/or control circuit 612 and/or other circuits (not shown) in DVD 610 can also perform other functions such as encoding and/or decoding and/or any other signal processing functions associated with a DVD drive.

DVD drive 610 may communicate with an output device (not shown) such as a computer, television or other device via one or more wired or wireless communication links 617. DVD 610 may communicate with mass data storage 618 that stores data in a nonvolatile manner. Mass data storage 618 may include a hard disk drive (HDD) such as that shown in FIG. 8A. The HDD may be a mini HDD that includes one or more platters having a diameter that is smaller than approximately 1.8" DVD 610 may be connected to memory 619, such as RAM, ROM, low latency nonvolatile memory such as flash memory, and/or other suitable electronic data storage.

Referring to FIG. 5C, a frequency divider may be utilized in a high definition television (HDTV) 620. The HDTV 620 includes signal processing and/or control circuits, which are generally identified in FIG. 8C at 622, a WLAN interface 629, and a mass data storage 627. The frequency divider may be utilized in the WLAN interface 629 or the signal processing circuit and/or control circuit 622, for example. HDTV 620 receives HDTV input signals in either a wired or wireless format and generates HDTV output signals for a display 626. In some implementations, signal processing circuit and/or control circuit 622 and/or other circuits (not shown) of HDTV 620 may process data, perform coding and/or encryption, perform calculations, format data and/or perform any other type of HDTV processing that may be required.

HDTV 620 may communicate with mass data storage 627 that stores data in a nonvolatile manner such as optical and/or magnetic storage devices. The mass data storage 627 may include one or more hard disk drives (HDDs) and/or one or more digital versatile disks (DVDs). At least one HDD may have the configuration shown in FIG. 8A and/or at least one DVD may have the configuration shown in FIG. 8B. One or more of the HDDs may be a mini HDD that includes one or more platters having a diameter that is smaller than approximately 1.8". HDTV 620 may be connected to memory 628 such as RAM, ROM, low latency nonvolatile memory such as flash memory and/or other suitable electronic data storage. HDTV 620 also may support connections with a WLAN via a WLAN network interface 629.

Figure 8D:
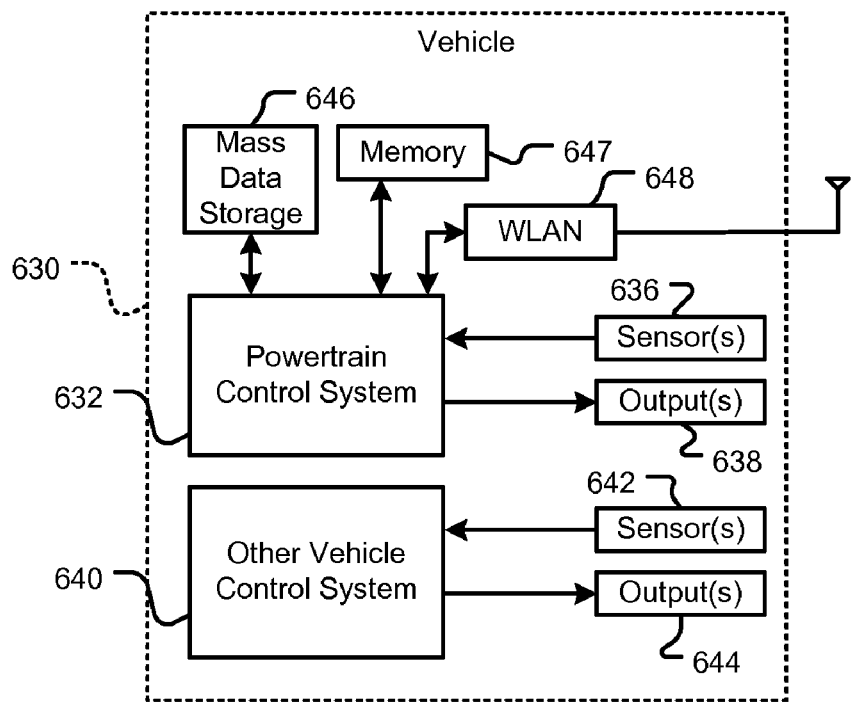
FIG. 8D is a block diagram of a vehicle that may utilize a frequency divider such as the frequency divider of FIG. 4 or the frequency divider of FIG. 6.

Referring now to FIG. 8D, a frequency divider may be utilized in a control system of a vehicle 630. In some implementations, they may be implemented by a powertrain control system 632 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The frequency divider may also be implemented in other control systems 640 of vehicle 630. Control system 640 may likewise receive signals from input sensors 642 and/or output control signals to one or more output devices 644. In some implementations, control system 640 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

Powertrain control system 632 may communicate with mass data storage 646 that stores data in a nonvolatile manner. Mass data storage 646 may include optical and/or magnetic storage devices for example hard disk drives HDD and/or DVDs. At least one HDD may have the configuration shown in FIG. 8A and/or at least one DVD may have the configuration shown in FIG. 8B. One or more of the HDDs may be a mini HDD that includes one or more platters having a diameter that is smaller than approximately 1.8". Powertrain control system 632 may be connected to memory 647 such as RAM, ROM, low latency nonvolatile memory such as flash memory and/or other suitable electronic data storage. Powertrain control system 632 also may support connections with a WLAN via a WLAN network interface 648. The methods, systems, techniques, etc., described above may also be implemented in the WLAN interface 648. The control system 640 may also include mass data storage, memory and/or a WLAN interface (all not shown).

Figure 8E:
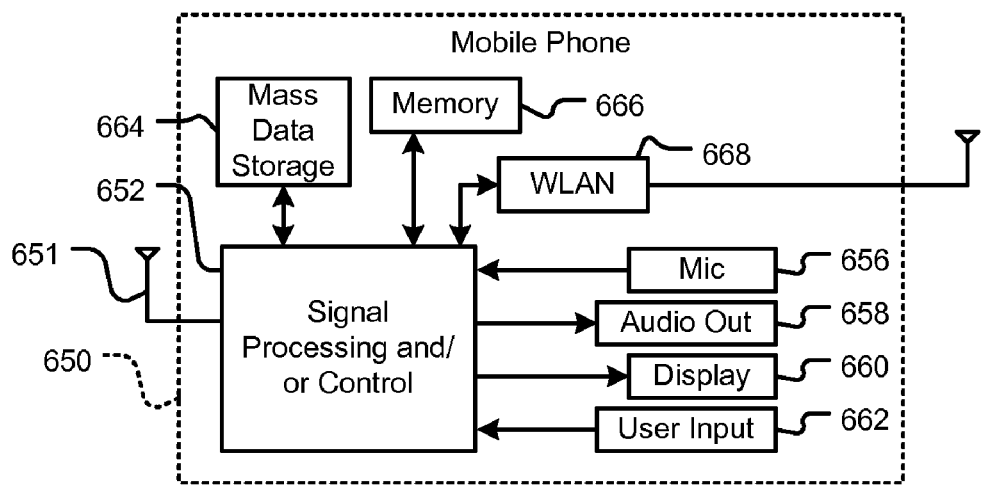
FIG. 8E is a block diagram of a mobile phone that may utilize a frequency divider such as the frequency divider of FIG. 4 or the frequency divider of FIG. 6.

Referring now to FIG. 8E, a frequency divider may be utilized in a mobile phone 650 (e.g., a cellular phone) that may include an antenna 651. The phone 650 includes signal processing and/or control circuits, which are generally identified in FIG. 8E at 652, a WLAN interface 668, and a mass data storage 664. The frequency divider may be implemented in the signal processing and/or control circuits 652 and/or the WLAN interface 668, for example. In some implementations, phone 650 includes a microphone 656, an audio output 658 such as a speaker and/or audio output jack, a display 660 and/or an input device 662 such as a keypad, pointing device, voice actuation and/or other input device. Signal processing and/or control circuits 652 and/or other circuits (not shown) in cellular phone 650 may process data, perform coding and/or encryption, perform calculations, format data and/or perform other cellular phone functions.

Phone 650 may communicate with mass data storage 664 that stores data in a nonvolatile manner such as optical and/or magnetic storage devices for example hard disk drives HDD and/or DVDs. At least one HDD may have the configuration shown in FIG. 8A and/or at least one DVD may have the configuration shown in FIG. 8B. At least one HDD may be a mini HDD that includes one or more platters having a diameter that is smaller than approximately 1.8". Phone 650 may be connected to memory 666 such as RAM, ROM, low latency nonvolatile memory such as flash memory and/or other suitable electronic data storage. Phone 650 also may support connections with a WLAN via a WLAN network interface 668.

Figure 8F:
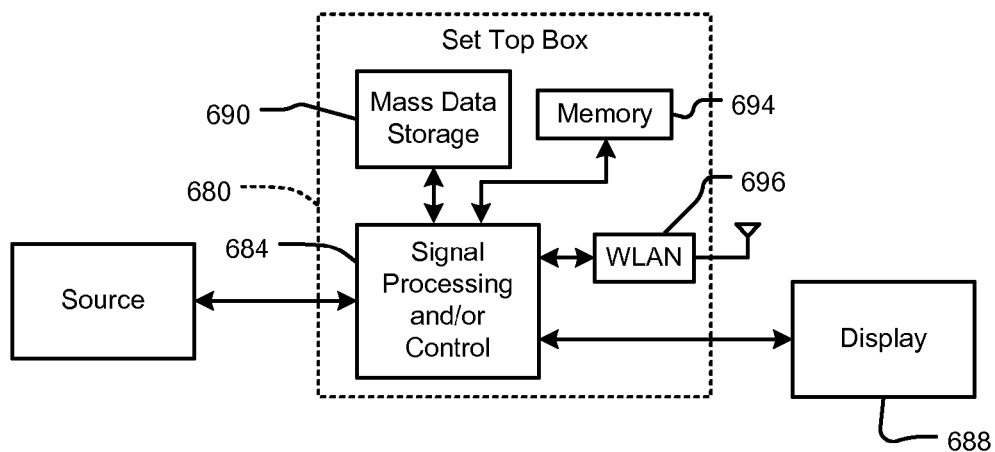
FIG. 8F is a block diagram of a set top box that may utilize a frequency divider such as the frequency divider of FIG. 4 or the frequency divider of FIG. 6.

Referring now to FIG. 8F, a frequency divider may be utilized in a set top box 680. The set top box 680 includes signal processing and/or control circuits, which are generally identified in FIG. 6D at 684, a WLAN interface 696, and a mass data storage device 690. The frequency divider may be implemented in the signal processing and/or control circuits 684 and/or the WLAN interface 696, for example. Set top box 680 receives signals from a source such as a broadband source and outputs standard and/or high definition audio/video signals suitable for a display 688 such as a television and/or monitor and/or other video and/or audio output devices. Signal processing and/or control circuits 684 and/or other circuits (not shown) of the set top box 680 may process data, perform coding and/or encryption, perform calculations, format data and/or perform any other set top box function.

Set top box 680 may communicate with mass data storage 690 that stores data in a nonvolatile manner. Mass data storage 690 may include optical and/or magnetic storage devices for example hard disk drives HDD and/or DVDs. At least one HDD may have the configuration shown in FIG. 8A and/or at least one DVD may have the configuration shown in FIG. 8B. At least one HDD may be a mini HDD that includes one or more platters having a diameter that is smaller than approximately 1.8". Set top box 680 may be connected to memory 694 such as RAM, ROM, low latency nonvolatile memory such as flash memory and/or other suitable electronic data storage. Set top box 680 also may support connections with a WLAN via a WLAN network interface 696.

Figure 8G:
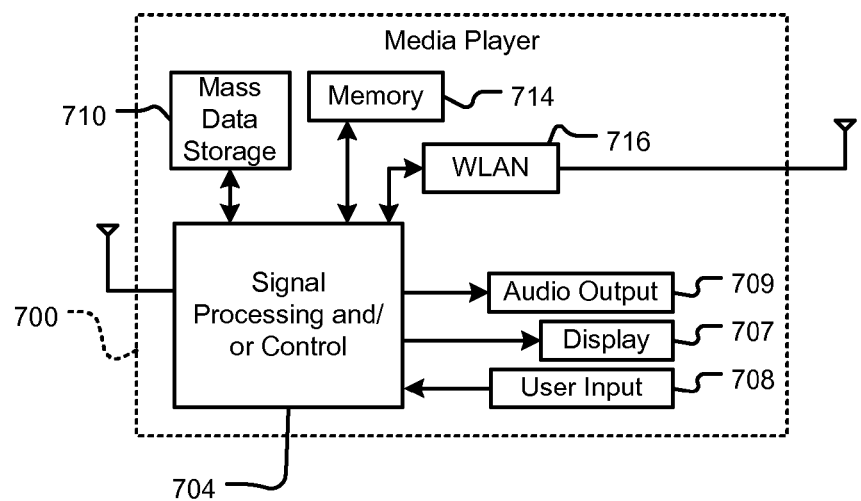
FIG. 8G is a block diagram of a media player that may utilize a frequency divider such as the frequency divider of FIG. 4 or the frequency divider of FIG. 6.

Referring now to FIG. 8G, a frequency divider may be utilized in a media player 700. The media player 700 may include signal processing and/or control circuits, which are generally identified in FIG. 8G at 704, a WLAN interface 716, and a mass data storage device 710. The frequency divider may be implemented in the signal processing and/or control circuits 704 and/or the WLAN interface 716, for example. In some implementations, media player 700 includes a display 707 and/or a user input 708 such as a keypad, touchpad and the like. In some implementations, media player 700 may employ a graphical user interface (GUI) that typically employs menus, drop down menus, icons and/or a point-and-click interface via display 707 and/or user input 708. Media player 700 further includes an audio output 709 such as a speaker and/or audio output jack. Signal processing and/or control circuits 704 and/or other circuits (not shown) of media player 700 may process data, perform coding and/or encryption, perform calculations, format data and/or perform any other media player function.

Media player 700 may communicate with mass data storage 710 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. At least one HDD may have the configuration shown in FIG. 8A and/or at least one DVD may have the configuration shown in FIG. 8B. At least one HDD may be a mini HDD that includes one or more platters having a diameter that is smaller than approximately 1.8". Media player 700 may be connected to memory 714 such as RAM, ROM, low latency nonvolatile memory such as flash memory and/or other suitable electronic data storage. Media player 700 also may support connections with a WLAN via a WLAN network interface 716. Still other implementations in addition to those described above are contemplated.

Figure 8H:
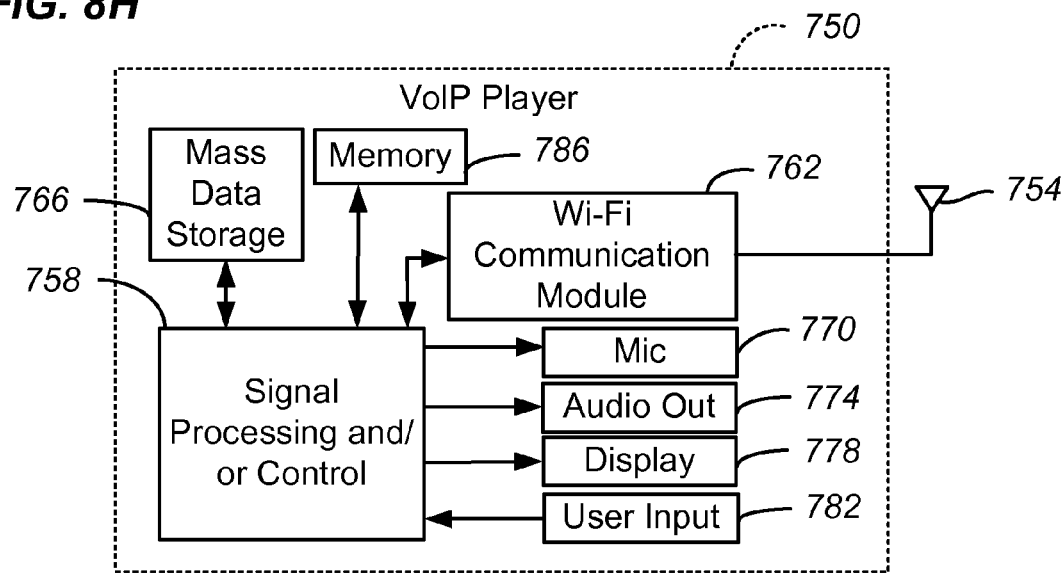
FIG. 8H is a block diagram of a voice over IP device that may utilize a frequency divider such as the frequency divider of FIG. 4 or the frequency divider of FIG. 6.

Referring to FIG. 8H, a frequency divider may be utilized in a Voice over Internet Protocol (VoIP) phone 750 that may include an antenna 754, signal processing and/or control circuits 758, a wireless interface 762, and a mass data storage 766. The frequency divider may be implemented in the signal processing and/or control circuits 758 and/or the wireless interface 762, for example. In some implementations, VoIP phone 750 includes, in part, a microphone 770, an audio output 774 such as a speaker and/or audio output jack, a display monitor 778, an input device 782 such as a keypad, pointing device, voice actuation and/or other input devices, and a Wireless Fidelity (Wi-Fi) communication module 762. Signal processing and/or control circuits 758 and/or other circuits (not shown) in VoIP phone 750 may process data, perform coding and/or encryption, perform calculations, format data and/or perform other VoIP phone functions.

VoIP phone 750 may communicate with mass data storage 766 that stores data in a nonvolatile manner such as optical and/or magnetic storage devices, for example hard disk drives HDD and/or DVDs. At least one HDD may have the configuration shown in FIG. 8A and/or at least one DVD may have the configuration shown in FIG. 8B. At least one HDD may have the configuration shown in FIG. 8A and/or at least one DVD may have the configuration shown in FIG. 8B. The HDD may be a mini HDD that includes one or more platters having a diameter that is smaller than approximately 1.8". VoIP phone 750 may be connected to memory 786, which may be a RAM, ROM, low latency nonvolatile memory such as flash memory and/or other suitable electronic data storage. VoIP phone 750 is configured to establish communications link with a VoIP network (not shown) via Wi-Fi communication module 762.

The various blocks, operations, and techniques described above may be implemented in hardware, firmware, software, or any combination of hardware, firmware, and/or software. When implemented in hardware, some or all of the blocks, operations, techniques, etc. may be implemented in, for example, a custom integrated circuit (IC), an application specific integrated circuit (ASIC), a field programmable logic array (FPGA), a programmable logic array (PLA), etc.

When implemented in software, the software may be stored in any computer readable memory such as on a magnetic disk, an optical disk, or other storage medium, in a RAM or ROM or flash memory of a computer, processor, hard disk drive, optical disk drive, tape drive, etc. Likewise, the software may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Thus, the software may be delivered to a user or a system via a communication channel such as a telephone line, a DSL line, a cable television line, the Internet, etc. (which are viewed as being the same as or interchangeable with providing such software via a transportable storage medium). When implemented in hardware, the hardware may comprise one or more of discrete components, an integrated circuit, an application-specific integrated circuit (ASIC), etc.

While the present invention has been described with reference to specific examples, which are intended to be illustrative only and not to be limiting of the invention, it will be apparent to those of ordinary skill in the art that changes, additions or deletions in addition to those explicitly described above may be made to the disclosed embodiments without departing from the spirit and scope of the invention.

What is claimed is:

1. A method of dividing a frequency of a clock signal, the method comprising:
    generating in a first stage a first frequency divided signal using the clock signal;
    generating in a second stage a second frequency divided signal using the clock signal and the first frequency divided signal; and
    generating in a third stage a third frequency divided signal using only i) the clock signal and ii) the second frequency divided signal so that any transition of the third frequency divided signal occurs at an edge of the clock signal at which the second frequency divided signal does not transition.

2. A method according to claim 1, wherein generating the third frequency divided signal comprises causing the third frequency divided signal to transition at a first transition of the clock signal after a second transition of the clock signal corresponding to a most recent transition in the second frequency divided signal and before a third transition of the clock signal corresponding to a next transition in the second frequency divided signal.

3. A method according to claim 1, wherein generating in the third stage the third frequency divided signal comprises:
    generating a delayed complement signal corresponding to a complement of the second frequency divided signal delayed by one period of the clock signal;
    generating an edge detection signal by logically combining the second frequency divided signal with the delayed complement signal; and
    generating the third frequency divided signal based on the edge detection signal.

4. A method according to claim 3, wherein generating the delayed complement signal comprises generating the delayed complement signal using a D-flip-flop; and
    wherein generating the edge detection signal comprises logically AND'ing the second frequency divided signal with the delayed complement signal.

5. A method according to claim 3, wherein generating in the second stage the second frequency divided signal comprises:
    generating a further delayed complement signal corresponding to a complement of the first frequency divided signal delayed by one period of the clock signal;
    generating a further edge detection signal by logically combining the first frequency divided signal with the further delayed complement signal; and
    generating the second frequency divided signal based on the further edge detection signal.

6. A frequency divider comprising:
    a first frequency divider stage coupled to a clock signal and operative to generate a first frequency divided signal;
    a second frequency divider stage coupled to the clock signal and to the first frequency divider stage and operative to generate a second frequency divided signal; and
    a third frequency divider stage coupled to the clock signal and to the second frequency divider stage and configured to generate a third frequency divided signal using only i) the clock signal and ii) the second frequency divided signal so that any transition of the third frequency divided signal occurs at an edge of the clock signal at which the second frequency divided signal does not transition.

7. A frequency divider according to claim 6, wherein the third frequency divider stage is configured to cause the third frequency divided signal to transition at a first transition of the clock signal after a second transition of the clock signal corresponding to a most recent transition in the second frequency divided signal and before a third transition of the clock signal corresponding to a next transition in the second frequency divided signal.

8. A frequency divider according to claim 6, wherein the third frequency divider stage comprises:
    an edge detector to generate an edge indicator signal using only i) the clock signal and ii) the second frequency divided signal; and
    a divider to generate the third frequency divided signal using the edge indicator signal.

9. A frequency divider according to claim 8, wherein the edge detector comprises:
    delay unit to generate a delayed complement signal corresponding to a complement of the second frequency divided signal delayed by one period of the clock signal; and
    a logic gate to generate the edge detection signal by logically combining the delayed complement signal and the second frequency signal.

10. A frequency divider according to claim 9, wherein the delay unit comprises a D-flip-flop; and
    wherein the logic gate comprises an AND gate.

11. A frequency divider according to claim 8, wherein the divider comprises a T-flip-flop.

12. A frequency divider according to claim 8, wherein the second frequency divider stage comprises:
    a further edge detector to generate a further edge indicator signal using only i) the clock signal and ii) the first frequency divided signal; and
    a further divider to generate the second frequency divided signal using the further edge indicator signal.

13. A frequency divider comprising:
    a plurality of frequency divider stages coupled in series including a first frequency divider stage, wherein each frequency divider stage subsequent to the first frequency divider stage is coupled to a clock signal and to an output of a previous frequency divider stage and is configured to generate a respective frequency divided signal using only i) the clock signal and ii) an output of the previous frequency divider stage, wherein each frequency divided signal has a corresponding frequency that is a respective fraction of a frequency of the clock signal, and wherein each frequency divider stage in the plurality of frequency divider stages subsequent to the first frequency divider stage comprises:

an edge detector to generate an edge indicator signal using only i) the clock signal and ii) the output of the previous frequency divider stage; and a divider to generate the respective frequency divided signal using the edge indicator signal.

14. A frequency divider according to claim 13, wherein the first frequency divider stage is configured to generate a respective frequency divided signal using only i) the clock signal and ii) an input of the first frequency divider stage.

15. A frequency divider according to claim 14, further comprising an additional frequency divider stage to generate the input of the first frequency divider stage.

16. A frequency divider according to claim 15, wherein the additional frequency divider stage has a structure different than a structure of each frequency divider stage in the plurality of frequency divider stages.

17. A frequency divider according to claim 13, wherein each edge detector comprises:

a delay unit to generate a delayed complement signal corresponding to a complement of the output of the previous frequency divider stage delayed by one period of the clock signal; and a logic device to generate the edge indicator signal by logically combining the delayed complement signal and the output of the previous frequency divider stage.

18. A frequency divider according to claim 17, wherein each delay unit comprises a D-flip-flop; and wherein each logic device comprises an AND gate.

* * * * *